(12) United States Patent
Salter et al.

(10) Patent No.: US 8,796,575 B2
(45) Date of Patent: Aug. 5, 2014

(54) PROXIMITY SWITCH ASSEMBLY HAVING GROUND LAYER

(71) Applicant: Ford Global Technologies, LLC, Dearborn, MI (US)

(72) Inventors: Stuart C. Salter, White Lake, MI (US); Yun Shin Lee, Shelby Township, MI (US); Pietro Buttolo, Dearborn Heights, MI (US); Cornel Lewis Gardner, Romulus, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 73 days.

(21) Appl. No.: 13/665,253

(22) Filed: Oct. 31, 2012

(65) Prior Publication Data

US 2014/0116869 A1 May 1, 2014

(51) Int. Cl.
*H03K 17/975* (2006.01)

(52) U.S. Cl.
USPC ........................................................ 200/600

(58) Field of Classification Search
CPC ........... H01H 9/00; H01H 9/04; H01H 21/00; H01H 23/00; H01H 36/00; H01H 53/00; H01H 2021/00; H01H 2025/00; H01H 2036/00
USPC ........... 200/553, 277.2, 302.3, 345, 600, 405, 200/510, 517, 518, 529, 556, 292, 307, 329, 200/339, 343

See application file for complete search history.

(56) References Cited

U.S. PATENT DOCUMENTS

| | | | |
|---|---|---|---|
| 3,382,588 A | 5/1968 | Serrell et al. |
| 3,544,804 A | 12/1970 | Gaumer et al. |
| 3,691,396 A | 9/1972 | Hinrichs |
| 3,707,671 A | 12/1972 | Morrow et al. |
| 3,826,979 A | 7/1974 | Steinmann |
| 4,204,204 A | 5/1980 | Pitstick |
| 4,205,325 A | 5/1980 | Haygood et al. |
| 4,232,289 A | 11/1980 | Daniel |

(Continued)

FOREIGN PATENT DOCUMENTS

| | | |
|---|---|---|
| DE | 4024052 | 1/1992 |
| EP | 1152443 | 11/2001 |

(Continued)

OTHER PUBLICATIONS

Van Ess, Dave et al., "Capacitive Touch Switches for Automotive Applications," 7 pages, Published in Automotive DesignLine, www.automotiedesignline.com, Feb. 2006.

(Continued)

*Primary Examiner* — Renee S Luebke
*Assistant Examiner* — Anthony R. Jimenez
(74) *Attorney, Agent, or Firm* — Vichit Chea; Price Heneveld LLP

(57) ABSTRACT

A vehicle proximity switch assembly includes a ground layer, a first proximity switch provided on a first major side of the ground layer and a second proximity switch provided on an opposite second major side of the ground layer. The first proximity switch includes a first proximity sensor and a first dielectric layer for controlling movement of a window panel in a first direction. The second proximity switch includes a second proximity sensor and a second dielectric layer for controlling movement of the window panel in a second direction.

20 Claims, 7 Drawing Sheets

(56) References Cited

U.S. PATENT DOCUMENTS

| | | |
|---|---|---|
| 4,257,117 A | 3/1981 | Besson |
| 4,290,052 A | 9/1981 | Eichelberger et al. |
| 4,340,813 A | 7/1982 | Sauer |
| 4,374,381 A | 2/1983 | Ng et al. |
| 4,380,040 A | 4/1983 | Posset |
| 4,413,252 A | 11/1983 | Tyler et al. |
| 4,431,882 A | 2/1984 | Frame |
| 4,446,380 A | 5/1984 | Moriya et al. |
| 4,453,112 A | 6/1984 | Sauer et al. |
| 4,492,958 A | 1/1985 | Minami |
| 4,494,105 A | 1/1985 | House |
| 4,502,726 A | 3/1985 | Adams |
| 4,514,817 A | 4/1985 | Pepper et al. |
| 4,613,802 A | 9/1986 | Kraus et al. |
| 4,680,429 A | 7/1987 | Murdock et al. |
| 4,743,895 A | 5/1988 | Alexander |
| 4,748,390 A | 5/1988 | Okushima et al. |
| 4,758,735 A | 7/1988 | Ingraham |
| 4,821,029 A | 4/1989 | Logan et al. |
| 4,855,550 A | 8/1989 | Schultz, Jr. |
| 4,872,485 A | 10/1989 | Laverty, Jr. |
| 4,899,138 A | 2/1990 | Araki et al. |
| 4,901,074 A | 2/1990 | Sinn et al. |
| 4,905,001 A | 2/1990 | Penner |
| 4,924,222 A | 5/1990 | Antikidis et al. |
| 4,972,070 A | 11/1990 | Laverty, Jr. |
| 5,025,516 A | 6/1991 | Wilson |
| 5,033,508 A | 7/1991 | Laverty, Jr. |
| 5,036,321 A | 7/1991 | Leach et al. |
| 5,063,306 A | 11/1991 | Edwards |
| 5,108,530 A | 4/1992 | Niebling, Jr. et al. |
| 5,153,590 A | 10/1992 | Charlier |
| 5,159,159 A | 10/1992 | Asher |
| 5,159,276 A | 10/1992 | Reddy, III |
| 5,177,341 A | 1/1993 | Balderson |
| 5,215,811 A | 6/1993 | Reafler et al. |
| 5,239,152 A | 8/1993 | Caldwell et al. |
| 5,270,710 A | 12/1993 | Gaultier et al. |
| 5,294,889 A | 3/1994 | Heep et al. |
| 5,329,239 A | 7/1994 | Kindermann et al. |
| 5,341,231 A | 8/1994 | Yamamoto et al. |
| 5,403,980 A | 4/1995 | Eckrich |
| 5,451,724 A | 9/1995 | Nakazawa et al. |
| 5,467,080 A | 11/1995 | Stoll et al. |
| 5,477,422 A | 12/1995 | Hooker et al. |
| 5,494,180 A | 2/1996 | Callahan |
| 5,512,836 A | 4/1996 | Chen et al. |
| 5,548,268 A | 8/1996 | Collins |
| 5,566,702 A | 10/1996 | Philipp |
| 5,572,205 A | 11/1996 | Caldwell et al. |
| 5,586,042 A | 12/1996 | Pisau et al. |
| 5,594,222 A | 1/1997 | Caldwell |
| 5,598,527 A | 1/1997 | Debrus et al. |
| 5,670,886 A | 9/1997 | Wolff et al. |
| 5,681,515 A | 10/1997 | Pratt et al. |
| 5,730,165 A | 3/1998 | Philipp |
| 5,747,756 A | 5/1998 | Boedecker |
| 5,760,554 A | 6/1998 | Bustamante |
| 5,790,107 A | 8/1998 | Kasser et al. |
| 5,796,183 A | 8/1998 | Hourmand |
| 5,825,352 A | 10/1998 | Bisset et al. |
| 5,864,105 A | 1/1999 | Andrews |
| 5,867,111 A | 2/1999 | Caldwell et al. |
| 5,874,672 A | 2/1999 | Gerardi et al. |
| 5,917,165 A | 6/1999 | Platt et al. |
| 5,920,309 A | 7/1999 | Bisset et al. |
| 5,942,733 A | 8/1999 | Allen et al. |
| 5,963,000 A | 10/1999 | Tsutsumi et al. |
| 5,973,417 A | 10/1999 | Goetz et al. |
| 5,973,623 A | 10/1999 | Gupta et al. |
| 6,010,742 A | 1/2000 | Tanabe et al. |
| 6,011,602 A | 1/2000 | Miyashita et al. |
| 6,031,465 A | 2/2000 | Burgess |
| 6,035,180 A | 3/2000 | Kubes et al. |
| 6,037,930 A | 3/2000 | Wolfe et al. |
| 6,040,534 A | 3/2000 | Beukema |
| 6,157,372 A | 12/2000 | Blackburn et al. |
| 6,172,666 B1 | 1/2001 | Okura |
| 6,215,476 B1 | 4/2001 | Depew et al. |
| 6,219,253 B1 | 4/2001 | Green |
| 6,231,111 B1 | 5/2001 | Carter et al. |
| 6,275,644 B1 | 8/2001 | Domas et al. |
| 6,288,707 B1 | 9/2001 | Philipp |
| 6,292,100 B1 | 9/2001 | Dowling |
| 6,310,611 B1 | 10/2001 | Caldwell |
| 6,320,282 B1 | 11/2001 | Caldwell |
| 6,323,919 B1 | 11/2001 | Yang et al. |
| 6,369,369 B2 | 4/2002 | Kochman et al. |
| 6,377,009 B1 | 4/2002 | Philipp |
| 6,379,017 B2 | 4/2002 | Nakabayashi et al. |
| 6,380,931 B1 | 4/2002 | Gillespie et al. |
| 6,415,138 B2 | 7/2002 | Sirola et al. |
| 6,427,540 B1 | 8/2002 | Monroe et al. |
| 6,452,138 B1 | 9/2002 | Kochman et al. |
| 6,452,514 B1 | 9/2002 | Philipp |
| 6,456,027 B1 | 9/2002 | Pruessel |
| 6,457,355 B1 | 10/2002 | Philipp |
| 6,464,381 B2 | 10/2002 | Anderson, Jr. et al. |
| 6,466,036 B1 | 10/2002 | Philipp |
| 6,485,595 B1 | 11/2002 | Yenni, Jr. et al. |
| 6,529,125 B1 | 3/2003 | Butler et al. |
| 6,535,200 B2 | 3/2003 | Philipp |
| 6,537,359 B1 | 3/2003 | Spa |
| 6,559,902 B1 | 5/2003 | Kusuda et al. |
| 6,587,097 B1 | 7/2003 | Aufderheide et al. |
| 6,607,413 B2 | 8/2003 | Stevenson et al. |
| 6,614,579 B2 | 9/2003 | Roberts et al. |
| 6,617,975 B1 | 9/2003 | Burgess |
| 6,639,159 B2 * | 10/2003 | Anzai .......................... 200/1 B |
| 6,652,777 B2 | 11/2003 | Rapp et al. |
| 6,654,006 B2 | 11/2003 | Kawashima et al. |
| 6,661,410 B2 | 12/2003 | Casebolt et al. |
| 6,664,489 B2 | 12/2003 | Kleinhans et al. |
| 6,713,897 B2 | 3/2004 | Caldwell |
| 6,734,377 B2 | 5/2004 | Gremm et al. |
| 6,738,051 B2 | 5/2004 | Boyd et al. |
| 6,740,416 B1 | 5/2004 | Yokogawa et al. |
| 6,756,970 B2 | 6/2004 | Keely, Jr. et al. |
| 6,773,129 B2 | 8/2004 | Anderson, Jr. et al. |
| 6,774,505 B1 | 8/2004 | Wnuk |
| 6,794,728 B1 | 9/2004 | Kithil |
| 6,795,226 B2 | 9/2004 | Agrawal et al. |
| 6,809,280 B2 | 10/2004 | Divigalpitiya et al. |
| 6,812,424 B2 | 11/2004 | Miyako |
| 6,819,316 B2 | 11/2004 | Schulz et al. |
| 6,819,990 B2 | 11/2004 | Ichinose |
| 6,825,752 B2 | 11/2004 | Nahata et al. |
| 6,834,373 B2 | 12/2004 | Dieberger |
| 6,841,748 B2 | 1/2005 | Serizawa et al. |
| 6,847,018 B2 | 1/2005 | Wong |
| 6,854,870 B2 | 2/2005 | Huizenga |
| 6,879,250 B2 | 4/2005 | Fayt et al. |
| 6,884,936 B2 | 4/2005 | Takahashi et al. |
| 6,891,114 B2 | 5/2005 | Peterson |
| 6,891,530 B2 | 5/2005 | Umemoto et al. |
| 6,897,390 B2 | 5/2005 | Caldwell et al. |
| 6,929,900 B2 | 8/2005 | Farquhar et al. |
| 6,930,672 B1 | 8/2005 | Kuribayashi |
| 6,940,291 B1 | 9/2005 | Ozick |
| 6,960,735 B2 | 11/2005 | Hein et al. |
| 6,964,023 B2 | 11/2005 | Maes et al. |
| 6,966,225 B1 | 11/2005 | Mallary |
| 6,967,587 B2 | 11/2005 | Snell et al. |
| 6,977,615 B2 | 12/2005 | Brandwein, Jr. |
| 6,987,605 B2 | 1/2006 | Liang et al. |
| 6,993,607 B2 | 1/2006 | Philipp |
| 6,999,066 B2 | 2/2006 | Litwiller |
| 7,030,513 B2 | 4/2006 | Caldwell |
| 7,046,129 B2 | 5/2006 | Regnet et al. |
| 7,053,360 B2 | 5/2006 | Balp et al. |
| 7,063,379 B2 | 6/2006 | Steuer et al. |
| 7,091,886 B2 | 8/2006 | DePue et al. |
| 7,098,414 B2 | 8/2006 | Caldwell |
| 7,105,752 B2 | 9/2006 | Tsai et al. |

(56) References Cited

U.S. PATENT DOCUMENTS

| | | |
|---|---|---|
| 7,106,171 B1 | 9/2006 | Burgess |
| 7,135,995 B2 | 11/2006 | Engelmann et al. |
| 7,146,024 B2 | 12/2006 | Benkley, III |
| 7,151,450 B2 | 12/2006 | Beggs et al. |
| 7,151,532 B2 | 12/2006 | Schulz |
| 7,154,481 B2 | 12/2006 | Cross et al. |
| 7,180,017 B2 | 2/2007 | Hein |
| 7,186,936 B2 | 3/2007 | Marcus et al. |
| 7,205,777 B2 | 4/2007 | Schulz et al. |
| 7,215,529 B2 | 5/2007 | Rosenau |
| 7,218,498 B2 | 5/2007 | Caldwell |
| 7,232,973 B2 | 6/2007 | Kaps et al. |
| 7,242,393 B2 | 7/2007 | Caldwell |
| 7,245,131 B2 | 7/2007 | Kurachi et al. |
| 7,248,151 B2 | 7/2007 | Mc Call |
| 7,248,955 B2 | 7/2007 | Hein et al. |
| 7,254,775 B2 | 8/2007 | Geaghan et al. |
| 7,255,466 B2 | 8/2007 | Schmidt et al. |
| 7,255,622 B2 | 8/2007 | Stevenson et al. |
| 7,269,484 B2 | 9/2007 | Hein |
| 7,295,168 B2 | 11/2007 | Saegusa et al. |
| 7,295,904 B2 | 11/2007 | Kanevsky et al. |
| 7,339,579 B2 | 3/2008 | Richter et al. |
| 7,342,485 B2 | 3/2008 | Joehl et al. |
| 7,355,595 B2 | 4/2008 | Bathiche et al. |
| 7,361,860 B2 | 4/2008 | Caldwell |
| 7,385,308 B2 | 6/2008 | Yerdon et al. |
| 7,445,350 B2 | 11/2008 | Konet et al. |
| 7,479,788 B2 | 1/2009 | Bolender et al. |
| 7,489,053 B2 | 2/2009 | Gentile et al. |
| 7,521,941 B2 | 4/2009 | Ely et al. |
| 7,521,942 B2 | 4/2009 | Reynolds |
| 7,531,921 B2 | 5/2009 | Cencur |
| 7,532,202 B2 | 5/2009 | Roberts |
| 7,535,131 B1 | 5/2009 | Safieh, Jr. |
| 7,535,459 B2 | 5/2009 | You et al. |
| 7,567,240 B2 | 7/2009 | Peterson, Jr. et al. |
| 7,583,092 B2 | 9/2009 | Reynolds et al. |
| 7,643,010 B2 | 1/2010 | Westerman et al. |
| 7,653,883 B2 | 1/2010 | Hotelling et al. |
| 7,688,080 B2 | 3/2010 | Golovchenko et al. |
| 7,701,440 B2 | 4/2010 | Harley |
| 7,705,257 B2 | 4/2010 | Arione et al. |
| 7,708,120 B2 | 5/2010 | Einbinder |
| 7,714,846 B1 | 5/2010 | Gray |
| 7,719,142 B2 | 5/2010 | Hein et al. |
| 7,728,819 B2 | 6/2010 | Inokawa |
| 7,737,953 B2 | 6/2010 | Mackey |
| 7,737,956 B2 | 6/2010 | Hsieh et al. |
| 7,777,732 B2 | 8/2010 | Herz et al. |
| 7,782,307 B2 | 8/2010 | Westerman et al. |
| 7,791,594 B2 | 9/2010 | Dunko |
| 7,795,882 B2 | 9/2010 | Kirchner et al. |
| 7,800,590 B2 | 9/2010 | Satoh et al. |
| 7,821,425 B2 | 10/2010 | Philipp |
| 7,834,853 B2 | 11/2010 | Finney et al. |
| 7,839,392 B2 | 11/2010 | Pak et al. |
| 7,876,310 B2 | 1/2011 | Westerman et al. |
| 7,881,940 B2 | 2/2011 | Dusterhoff |
| RE42,199 E | 3/2011 | Caldwell |
| 7,898,531 B2 | 3/2011 | Bowden et al. |
| 7,920,131 B2 | 4/2011 | Westerman |
| 7,924,143 B2 | 4/2011 | Griffin et al. |
| 7,957,864 B2 | 6/2011 | Lenneman et al. |
| 7,977,596 B2 | 7/2011 | Born et al. |
| 7,978,181 B2 | 7/2011 | Westerman |
| 7,989,752 B2 | 8/2011 | Yokozawa |
| 8,026,904 B2 | 9/2011 | Westerman |
| 8,050,876 B2 | 11/2011 | Feen et al. |
| 8,054,296 B2 | 11/2011 | Land et al. |
| 8,054,300 B2 | 11/2011 | Bernstein |
| 8,077,154 B2 | 12/2011 | Emig et al. |
| 8,090,497 B2 | 1/2012 | Ando |
| 8,253,425 B2 | 8/2012 | Reynolds et al. |
| 8,283,800 B2 | 10/2012 | Salter et al. |
| 8,330,385 B2 | 12/2012 | Salter et al. |
| 8,339,286 B2 | 12/2012 | Cordeiro |
| 8,454,181 B2 | 6/2013 | Salter et al. |
| 8,508,487 B2 | 8/2013 | Schwesig et al. |
| 8,575,949 B2 | 11/2013 | Salter et al. |
| 2001/0019228 A1 | 9/2001 | Gremm |
| 2001/0028558 A1 | 10/2001 | Rapp et al. |
| 2002/0040266 A1 | 4/2002 | Edgar et al. |
| 2002/0084721 A1 | 7/2002 | Walczak |
| 2002/0093786 A1 | 7/2002 | Maser |
| 2002/0149376 A1 | 10/2002 | Haffner et al. |
| 2002/0167439 A1 | 11/2002 | Bloch et al. |
| 2002/0167704 A1 | 11/2002 | Kleinhans et al. |
| 2003/0002273 A1 | 1/2003 | Anderson, Jr. et al. |
| 2003/0122554 A1 | 7/2003 | Karray et al. |
| 2004/0056753 A1 | 3/2004 | Chiang et al. |
| 2004/0145613 A1 | 7/2004 | Stavely et al. |
| 2004/0160072 A1 | 8/2004 | Carter et al. |
| 2004/0160713 A1 | 8/2004 | Wei |
| 2004/0197547 A1 | 10/2004 | Bristow et al. |
| 2004/0246239 A1 | 12/2004 | Knowles et al. |
| 2005/0052429 A1 | 3/2005 | Philipp |
| 2005/0068712 A1 | 3/2005 | Schulz et al. |
| 2005/0088417 A1 | 4/2005 | Mulligan |
| 2005/0110769 A1 | 5/2005 | DaCosta et al. |
| 2005/0137765 A1 | 6/2005 | Hein et al. |
| 2005/0242923 A1 | 11/2005 | Pearson et al. |
| 2005/0275567 A1 | 12/2005 | DePue et al. |
| 2006/0022682 A1 | 2/2006 | Nakamura et al. |
| 2006/0038793 A1 | 2/2006 | Philipp |
| 2006/0044800 A1 | 3/2006 | Reime |
| 2006/0082545 A1 | 4/2006 | Choquet et al. |
| 2006/0244733 A1 | 11/2006 | Geaghan |
| 2006/0262549 A1 | 11/2006 | Schmidt et al. |
| 2006/0267953 A1 | 11/2006 | Peterson, Jr. et al. |
| 2006/0279015 A1 | 12/2006 | Wang |
| 2006/0287474 A1 | 12/2006 | Crawford et al. |
| 2007/0008726 A1 | 1/2007 | Brown |
| 2007/0023265 A1 | 2/2007 | Ishikawa et al. |
| 2007/0051609 A1 | 3/2007 | Parkinson |
| 2007/0068790 A1 | 3/2007 | Yerdon et al. |
| 2007/0096565 A1 | 5/2007 | Breed et al. |
| 2007/0103431 A1 | 5/2007 | Tabatowski-Bush |
| 2007/0226994 A1 | 10/2007 | Wollach et al. |
| 2007/0232779 A1 | 10/2007 | Moody et al. |
| 2007/0247429 A1 | 10/2007 | Westerman |
| 2007/0255468 A1 | 11/2007 | Strebel et al. |
| 2007/0257891 A1 | 11/2007 | Esenther et al. |
| 2007/0296709 A1 | 12/2007 | GuangHai |
| 2008/0012835 A1 | 1/2008 | Rimon et al. |
| 2008/0018604 A1 | 1/2008 | Paun et al. |
| 2008/0023715 A1 | 1/2008 | Choi |
| 2008/0030465 A1 | 2/2008 | Konet et al. |
| 2008/0074398 A1* | 3/2008 | Wright .......................... 345/173 |
| 2008/0111714 A1 | 5/2008 | Kremin |
| 2008/0136792 A1 | 6/2008 | Peng et al. |
| 2008/0142352 A1* | 6/2008 | Wright .......................... 200/600 |
| 2008/0143681 A1 | 6/2008 | XiaoPing |
| 2008/0150905 A1 | 6/2008 | Grivna et al. |
| 2008/0158146 A1 | 7/2008 | Westerman |
| 2008/0196945 A1 | 8/2008 | Konstas |
| 2008/0202912 A1 | 8/2008 | Boddie et al. |
| 2008/0231290 A1 | 9/2008 | Zhitomirsky |
| 2008/0238650 A1 | 10/2008 | Riihimaki et al. |
| 2008/0257706 A1 | 10/2008 | Haag |
| 2008/0272623 A1 | 11/2008 | Kadzban et al. |
| 2009/0066659 A1 | 3/2009 | He et al. |
| 2009/0079699 A1 | 3/2009 | Sun |
| 2009/0108985 A1 | 4/2009 | Haag et al. |
| 2009/0115731 A1 | 5/2009 | Rak |
| 2009/0120697 A1 | 5/2009 | Wilner et al. |
| 2009/0135157 A1 | 5/2009 | Harley |
| 2009/0225043 A1 | 9/2009 | Rosener |
| 2009/0235588 A1 | 9/2009 | Patterson et al. |
| 2009/0236210 A1 | 9/2009 | Clark et al. |
| 2009/0251435 A1 | 10/2009 | Westerman et al. |
| 2009/0309616 A1 | 12/2009 | Klinghult et al. |
| 2010/0001974 A1 | 1/2010 | Su et al. |
| 2010/0007613 A1 | 1/2010 | Costa |

(56) References Cited

U.S. PATENT DOCUMENTS

| | | |
|---|---|---|
| 2010/0007620 A1 | 1/2010 | Hsieh et al. |
| 2010/0013777 A1 | 1/2010 | Baudisch et al. |
| 2010/0026654 A1 | 2/2010 | Suddreth |
| 2010/0039392 A1 | 2/2010 | Pratt et al. |
| 2010/0090712 A1 | 4/2010 | Vandermeijden |
| 2010/0090966 A1 | 4/2010 | Gregorio |
| 2010/0102830 A1 | 4/2010 | Curtis et al. |
| 2010/0103139 A1 | 4/2010 | Soo et al. |
| 2010/0110037 A1 | 5/2010 | Huang et al. |
| 2010/0125393 A1 | 5/2010 | Jarvinen et al. |
| 2010/0156814 A1 | 6/2010 | Weber et al. |
| 2010/0177057 A1 | 7/2010 | Flint et al. |
| 2010/0188356 A1 | 7/2010 | Vu et al. |
| 2010/0188364 A1 | 7/2010 | Lin et al. |
| 2010/0194692 A1 | 8/2010 | Orr et al. |
| 2010/0207907 A1 | 8/2010 | Tanabe et al. |
| 2010/0214253 A1 | 8/2010 | Wu et al. |
| 2010/0241431 A1 | 9/2010 | Weng et al. |
| 2010/0241983 A1 | 9/2010 | Walline et al. |
| 2010/0245286 A1 | 9/2010 | Parker |
| 2010/0250071 A1 | 9/2010 | Pala et al. |
| 2010/0277431 A1 | 11/2010 | Klinghult |
| 2010/0280983 A1 | 11/2010 | Cho et al. |
| 2010/0286867 A1 | 11/2010 | Bergholz et al. |
| 2010/0289754 A1 | 11/2010 | Sleeman et al. |
| 2010/0289759 A1 | 11/2010 | Fisher et al. |
| 2010/0296303 A1 | 11/2010 | Sarioglu et al. |
| 2010/0302200 A1 | 12/2010 | Netherton et al. |
| 2010/0315267 A1 | 12/2010 | Chung et al. |
| 2010/0321214 A1 | 12/2010 | Wang et al. |
| 2010/0321321 A1 | 12/2010 | Shenfield et al. |
| 2010/0321335 A1 | 12/2010 | Lim et al. |
| 2010/0328261 A1 | 12/2010 | Woolley et al. |
| 2010/0328262 A1 | 12/2010 | Huang et al. |
| 2011/0001707 A1 | 1/2011 | Faubert et al. |
| 2011/0001722 A1 | 1/2011 | Newman et al. |
| 2011/0007021 A1 | 1/2011 | Bernstein et al. |
| 2011/0007023 A1 | 1/2011 | Abrahamsson et al. |
| 2011/0012623 A1 | 1/2011 | Gastel et al. |
| 2011/0018744 A1 | 1/2011 | Philipp |
| 2011/0018817 A1 | 1/2011 | Kryze et al. |
| 2011/0022393 A1 | 1/2011 | Waller et al. |
| 2011/0031983 A1 | 2/2011 | David et al. |
| 2011/0034219 A1 | 2/2011 | Filson et al. |
| 2011/0037725 A1 | 2/2011 | Pryor |
| 2011/0037735 A1 | 2/2011 | Land et al. |
| 2011/0039602 A1 | 2/2011 | McNamara et al. |
| 2011/0043481 A1 | 2/2011 | Bruwer |
| 2011/0050251 A1 | 3/2011 | Franke et al. |
| 2011/0050587 A1 | 3/2011 | Natanzon et al. |
| 2011/0050618 A1 | 3/2011 | Murphy et al. |
| 2011/0050620 A1 | 3/2011 | Hristov |
| 2011/0055753 A1 | 3/2011 | Horodezky et al. |
| 2011/0062969 A1 | 3/2011 | Hargreaves et al. |
| 2011/0063425 A1 | 3/2011 | Tieman |
| 2011/0074573 A1 | 3/2011 | Seshadri |
| 2011/0080365 A1 | 4/2011 | Westerman |
| 2011/0080366 A1 | 4/2011 | Bolender |
| 2011/0080376 A1 | 4/2011 | Kuo et al. |
| 2011/0082616 A1 | 4/2011 | Small et al. |
| 2011/0083110 A1 | 4/2011 | Griffin et al. |
| 2011/0095997 A1 | 4/2011 | Philipp |
| 2011/0115732 A1 | 5/2011 | Coni et al. |
| 2011/0115742 A1 | 5/2011 | Sobel et al. |
| 2011/0134047 A1 | 6/2011 | Wigdor et al. |
| 2011/0134054 A1 | 6/2011 | Woo et al. |
| 2011/0141006 A1 | 6/2011 | Rabu |
| 2011/0141041 A1 | 6/2011 | Parkinson et al. |
| 2011/0148803 A1 | 6/2011 | Xu |
| 2011/0157037 A1 | 6/2011 | Shamir et al. |
| 2011/0157079 A1 | 6/2011 | Wu et al. |
| 2011/0157080 A1 | 6/2011 | Ciesla et al. |
| 2011/0157089 A1 | 6/2011 | Rainisto |
| 2011/0161001 A1 | 6/2011 | Fink |
| 2011/0169758 A1 | 7/2011 | Aono |
| 2011/0187492 A1 | 8/2011 | Newman et al. |
| 2011/0279276 A1 | 11/2011 | Newham |
| 2011/0279409 A1 | 11/2011 | Salaverry et al. |
| 2012/0007821 A1 | 1/2012 | Zaliva |
| 2012/0037485 A1 | 2/2012 | Sitarski |
| 2012/0043976 A1 | 2/2012 | Bokma et al. |
| 2012/0062247 A1 | 3/2012 | Chang |
| 2012/0062498 A1 | 3/2012 | Weaver et al. |
| 2012/0068956 A1 | 3/2012 | Jira et al. |
| 2012/0154324 A1 | 6/2012 | Wright et al. |
| 2012/0217147 A1 | 8/2012 | Porter et al. |
| 2012/0312676 A1 | 12/2012 | Salter et al. |
| 2012/0313648 A1 | 12/2012 | Salter et al. |
| 2013/0036529 A1 | 2/2013 | Salter et al. |
| 2013/0076121 A1 | 3/2013 | Salter et al. |
| 2013/0093500 A1 | 4/2013 | Bruwer |
| 2013/0113397 A1 | 5/2013 | Salter et al. |
| 2013/0113544 A1 | 5/2013 | Salter et al. |
| 2013/0126325 A1 | 5/2013 | Curtis et al. |
| 2013/0270896 A1 | 10/2013 | Buttolo et al. |
| 2013/0270899 A1 | 10/2013 | Buttolo et al. |
| 2013/0271157 A1 | 10/2013 | Buttolo et al. |
| 2013/0271159 A1 | 10/2013 | Santos et al. |
| 2013/0271182 A1 | 10/2013 | Buttolo et al. |
| 2013/0271202 A1 | 10/2013 | Buttolo et al. |
| 2013/0271203 A1 | 10/2013 | Salter et al. |
| 2013/0271204 A1 | 10/2013 | Salter et al. |
| 2013/0291439 A1 | 11/2013 | Wuerstlein et al. |
| 2013/0307610 A1 | 11/2013 | Salter et al. |
| 2013/0321065 A1 | 12/2013 | Salter et al. |
| 2013/0328616 A1 | 12/2013 | Buttolo et al. |
| 2014/0002405 A1 | 1/2014 | Salter et al. |

FOREIGN PATENT DOCUMENTS

| | | |
|---|---|---|
| EP | 1327860 | 7/2003 |
| EP | 1562293 | 8/2005 |
| EP | 2133777 | 10/2011 |
| EP | 2133777 B1 | 10/2011 |
| GB | 2071338 | 9/1981 |
| GB | 2158737 | 11/1985 |
| GB | 2279750 | 1/1995 |
| GB | 2409578 | 6/2005 |
| GB | 2418741 | 4/2006 |
| JP | 61188515 | 8/1986 |
| JP | 4065038 | 3/1992 |
| JP | 04082416 | 3/1992 |
| JP | 07315880 | 12/1995 |
| JP | 08138446 | 5/1996 |
| JP | 11065764 | 3/1999 |
| JP | 11110131 | 4/1999 |
| JP | 11260133 | 9/1999 |
| JP | 11316553 | 11/1999 |
| JP | 2000047178 | 2/2000 |
| JP | 2000075293 | 3/2000 |
| JP | 2001013868 | 1/2001 |
| JP | 2006007764 | 1/2006 |
| JP | 2007027034 | 2/2007 |
| JP | 2008033701 | 2/2008 |
| JP | 2010139362 | 6/2010 |
| JP | 2010165618 | 7/2010 |
| JP | 2010218422 | 9/2010 |
| JP | 2010239587 | 10/2010 |
| JP | 2010287148 | 12/2010 |
| JP | 2011014280 | 1/2011 |
| KR | 20040110463 | 12/2004 |
| KR | 20090127544 | 12/2009 |
| KR | 20100114768 | 10/2010 |
| WO | 9636960 | 11/1996 |
| WO | 9963394 | 12/1999 |
| WO | 2006093398 | 9/2006 |
| WO | 2007022027 | 2/2007 |
| WO | 2008121760 | 10/2008 |
| WO | 2009054592 | 4/2009 |
| WO | 2010111362 | 9/2010 |
| WO | 2012032318 | 3/2012 |
| WO | 2012032318 A1 | 3/2012 |

(56) References Cited

FOREIGN PATENT DOCUMENTS

| WO | 2012169106 | | 12/2012 |
|---|---|---|---|
| WO | 2012169106 | A1 | 12/2012 |

OTHER PUBLICATIONS

"Introduction to Touch Solutions, White Paper, Rivision 1.0 A," Densitron Corporation, 14 pages, Aug. 21, 2007.

Kliffken, Marksu G. et al., "Obstacle Detection for Power Operated Window-Lift and Sunroof Actuation Systems," Paper No. 2001-01-0466, 1 page, © 2011 SAE International, Published Mar. 5, 2001.

NXP Capacitive Sensors, 1 page, www.nxp.com, copyrighted 2006-2010, NXP Semiconductors.

"Moisture Immunity in QuickSense Studio," AN552, Rev. 0.1 10/10, 8 pages, Silicon Laboratories, Inc., © 2010.

"CLEVIOS P Formulation Guide," 12 pages, www.clevios.com, Heraeus Clevios GmbH, no date provided.

"Charge-Transfer Sensing-Based Touch Controls Facilitate Creative Interfaces," www.ferret.com.au, 2 pages, Jan. 18, 2006.

Kiosk Peripherals, "Touch Screen," www.bitsbytesintegrators.com/kiosk-peripherals.html, 10 pages, no date provided.

JVC KD-AVX777 Detachable Front-Panel with Integrated 5.4" Touch-Screen Monitor, 6 pages, www.crutchfield.com, no date provided.

Ergonomic Palm Buttons, Pepperl+Fuchs, www.wolfautomation.com, 6 pages, no date provided.

"Orgacon EL-P3000, Screen printing Ink Series 3000," 2 pages, AGFA, last updated in Feb. 2006.

U.S. Appl. No. 13/609,390, filed Sep. 11, 2012, entitled "Proximity Switch Based Door Latch Release," (14 pages of specification and 4 pages of drawings) and Official Filing Receipt (3 pages).

U.S. Appl. No. 13/799,413, filed Mar. 13, 2013, entitled "Proximity Interface Development System Having Replicator and Method," (29 pages of specification and 20 pages of drawings) and Official Filing Receipt (3 pages).

U.S. Appl. No. 13/799,478, filed Mar. 13, 2013, entitled "Proximity Interface Development System Having Analyzer and Method," (29 pages of specification and 20 pages of drawings) and Official Filing Receipt (3 pages).

U.S. Appl. No. 14/168,614, filed Jan. 30, 2014, entitled "Proximity Switch Assembly and Activation Method Having Virtual Button Mode," (30 pages of specification and 15 pages of drawings) and Official Filing Receipt (3 pages).

"Touch Sensors Design Guide" by Atmel, 10620 D-AT42-04/09, Revised Apr. 2009, 72 pages, Copyrighted 2008-2009 Atmel Corporation.

\* cited by examiner

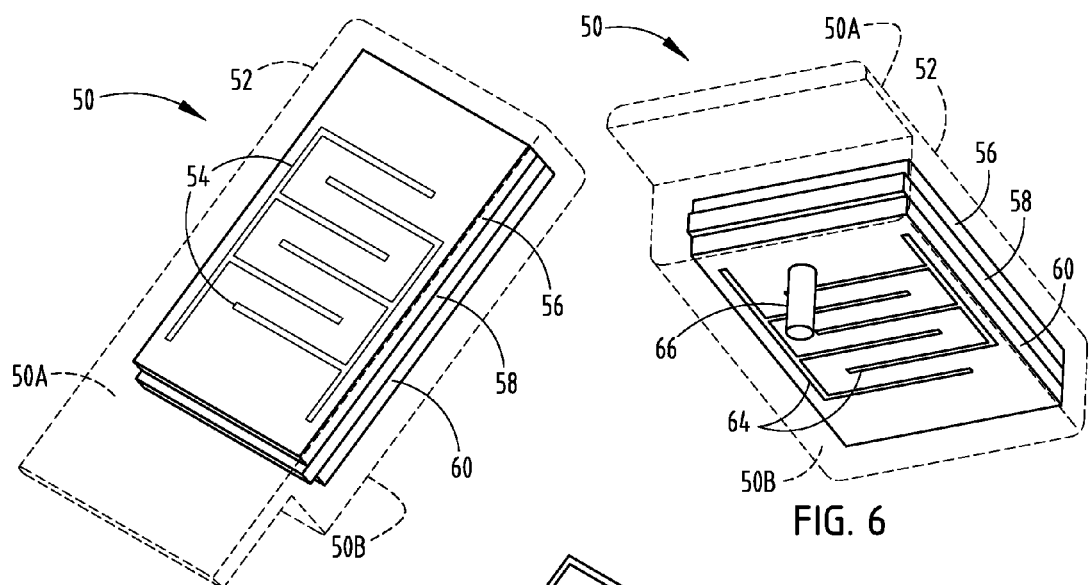
FIG. 5
FIG. 6
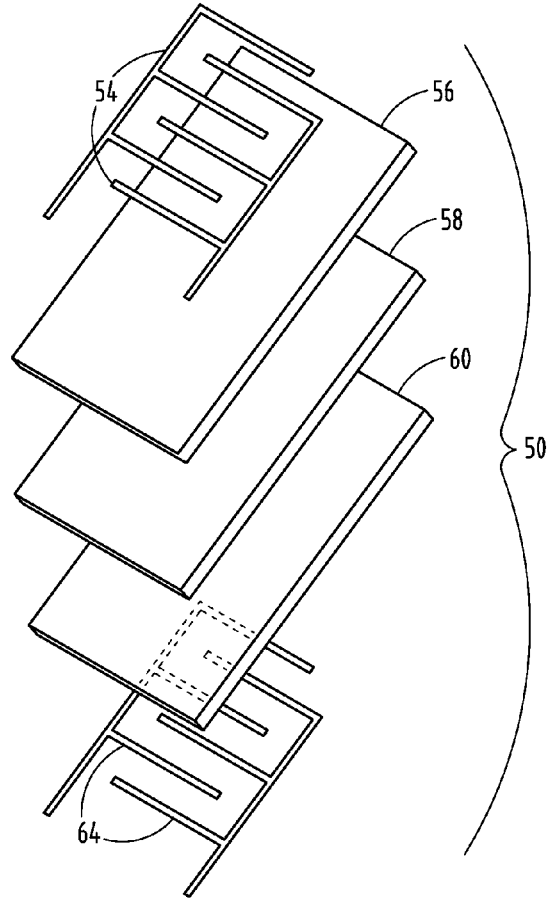
FIG. 7

US 8,796,575 B2

PROXIMITY SWITCH ASSEMBLY HAVING GROUND LAYER

FIELD OF THE INVENTION

The present invention generally relates to proximity switches, and more particularly relates to an arrangement of proximity switches for controlling devices, such as vehicle windows.

BACKGROUND OF THE INVENTION

Automotive vehicles are typically equipped with various user actuatable switches for operating devices including powered windows, moonroofs or sunroofs, door locks, and various other devices. Generally, these types of switches are actuated by a user to activate or deactivate a device or perform some type of control function. Proximity switches, such as capacitive switches, employ one or more proximity sensors to generate a sense activation field and sense changes to the activation field indicative of user actuation of the switch, typically caused by a user's finger in close proximity or contact with the sensor. Capacitive switches are typically configured to detect user actuation of the switch based on comparison of the sense activation field with a threshold.

It is desirable to provide for an arrangement of proximity switches in a manner that prevents or reduces interference from adjacent sensors.

SUMMARY OF THE INVENTION

According to one aspect of the present invention, a proximity switch assembly is provided. The proximity switch assembly includes a ground layer, a first proximity switch, and a second proximity switch. The first proximity switch includes a first proximity sensor and a first dielectric layer on a first side of the ground layer. The second proximity switch includes a second proximity sensor and a second dielectric layer on a second side of the ground layer.

According to another aspect of the present invention, a vehicle proximity switch assembly is provided. The vehicle proximity switch assembly includes a ground layer. The switch assembly also includes a first proximity switch on a first major side of the ground layer and including a first proximity sensor and a first dielectric layer for controlling movement of a panel. The vehicle proximity switch assembly further includes a second proximity switch on an opposite second major side of the ground layer and including a second proximity sensor and a second dielectric layer for controlling movement of the panel.

These and other aspects, objects, and features of the present invention will be understood and appreciated by those skilled in the art upon studying the following specification, claims, and appended drawings.

BRIEF DESCRIPTION OF THE DRAWINGS

In the drawings:

FIG. 5 is a top perspective view of the switch assembly with the cover shown in phantom;

FIG. 6 is a bottom perspective view of the switch assembly with the cover shown in phantom;

FIG. 7 is an exploded view of the proximity switch assembly without the cover;

DETAILED DESCRIPTION OF THE PREFERRED EMBODIMENTS

As required, detailed embodiments of the present invention are disclosed herein; however, it is to be understood that the disclosed embodiments are merely exemplary of the invention that may be embodied in various and alternative forms. The figures are not necessarily to a detailed design; some schematics may be exaggerated or minimized to show function overview. Therefore, specific structural and functional details disclosed herein are not to be interpreted as limiting, but merely as a representative basis for teaching one skilled in the art to variously employ the present invention.

Figure 1:
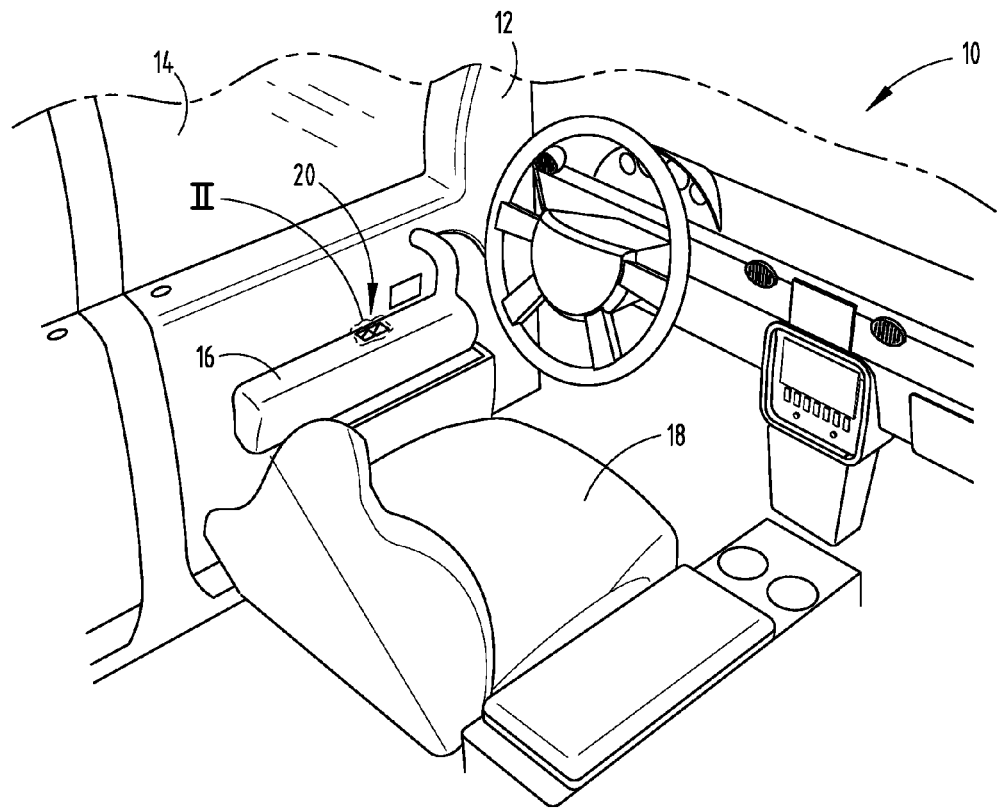
FIG. 1 is a perspective view of a passenger compartment of an automotive vehicle having a vehicle door employing a proximity switch assembly for controlling a vehicle window, according to one embodiment.

Referring to FIG. 1, an interior of an automotive vehicle is generally illustrated having a passenger compartment and a vehicle door 12, shown as a driver side door adjacent to the driver's seat 18. The vehicle door 12 has a movable window 14, also referred to as a power window, that moves a glass window panel downwards in a first direction towards an open position and upwards in a second direction towards a closed window position. The window panel 14 is generally actuated by a motor, such as an electric motor, typically in response to a user input switch. While the vehicle 10 is generally shown having a front driver side door 12 and movable window 14 therein, it should be appreciated that the vehicle 10 may be equipped with a plurality of doors each employing a movable window, and the vehicle may be equipped with other movable panels that are actuatable to move in response to activation of a user input switch.

The vehicle 10 is further equipped with a proximity switch assembly 20 for controlling actuation of the movable window panel 14. The proximity switch assembly 20 is shown located on an armrest 16 on the interior trim of door 12, according to one embodiment. However, it should be appreciated that the proximity switch assembly 20 may be located elsewhere on the vehicle 10. The proximity switch assembly 20 includes a first proximity switch having a first proximity sensor for sensing user activation on one surface and a second proximity switch having a second proximity sensor for sensing user activation on an opposite second surface. The first proximity switch senses user activation to activate the window panel 14 to move downward to an open position and the second proximity switch senses activation to move the window panel 14 upward to a closed position.

Figure 2:
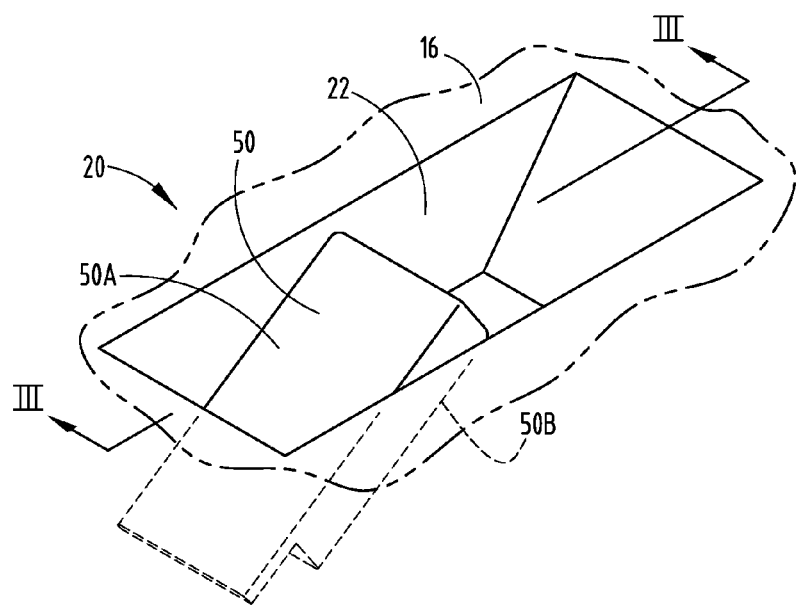
FIG. 2 is an enlarged view of the door handle showing the proximity switch assembly on the door handle.

The proximity switch assembly 20 is further illustrated in FIG. 2 having a finger actuatable switch member 50 shown having a top side 50A and a bottom side 50B which serves as a user input. The finger actuatable switch member 50 is stationary and is shown extending within a recess or channel 22 provided in the vehicle armrest 16. Member 50 has a top surface 50A positioned to receive and be contacted by a finger of a user as an input to actuate downward movement of the window panel 14 to open the window. The bottom surface 50B is accessible to allow a user's finger to extend around the inclined body of member 50 and onto the bottom surface 50B as an input to actuate the window panel 14 upward to close the window. Channel 22 allows for space so that the user's finger may extend around member 50 to reach and contact the bottom side 50B. Member 50 is shown inclined at an angle, however, it could be otherwise oriented such as horizontal.

Figure 3:
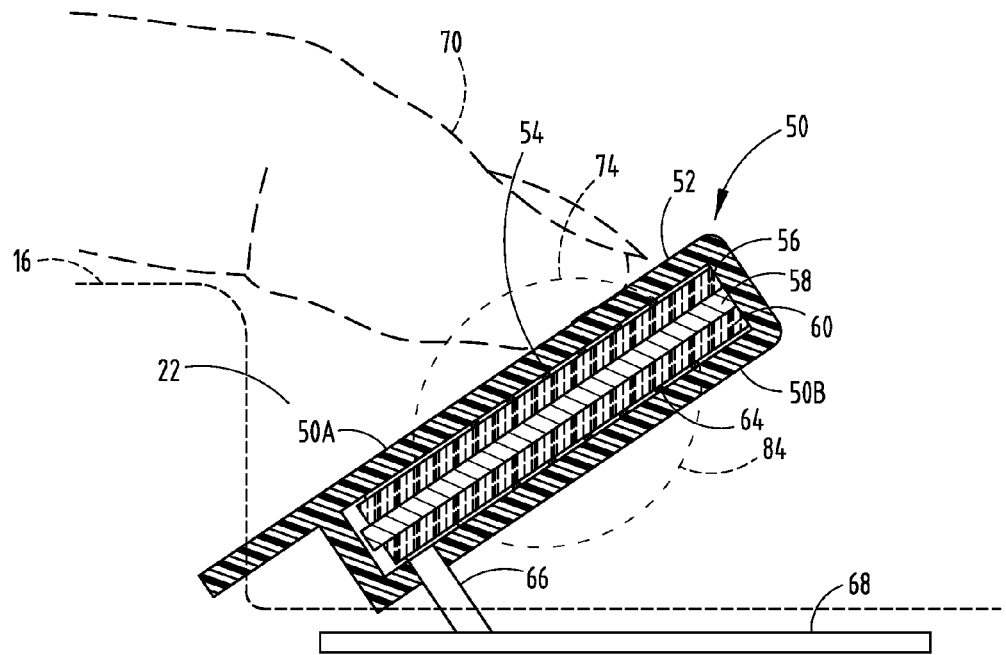
FIG. 3 is a cross-sectional view of the proximity switch assembly taken through lines III-III of FIG. 2 illustrating a user's finger activating the top proximity switch.
Figure 4:
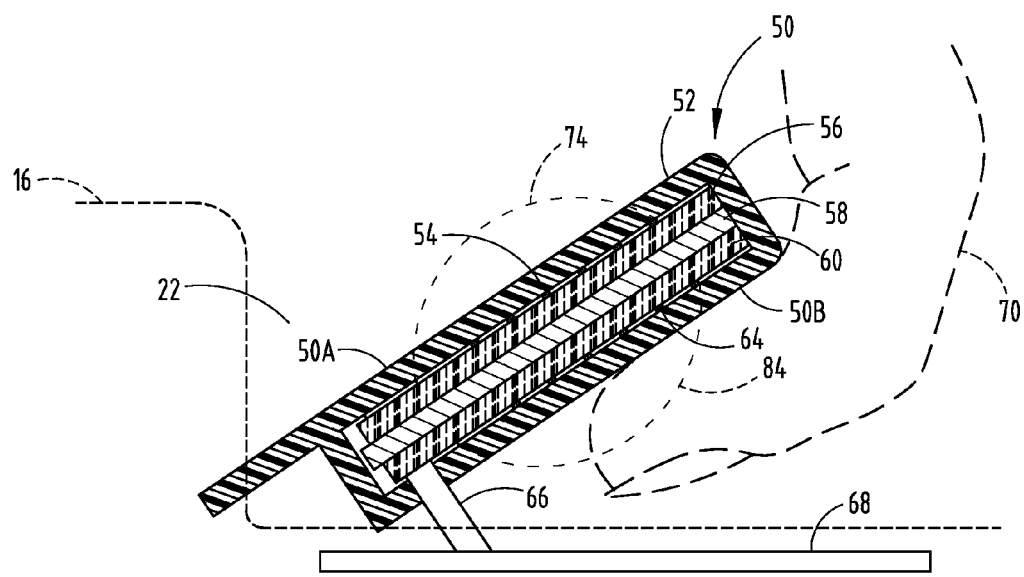
FIG. 4 is a cross-sectional view taken through the switch assembly illustrating the user's finger activating the bottom proximity switch.

Referring to FIGS. 3 and 4, a user's finger 70 is shown in phantom engaging the top surface 50A of member 50 in FIG. 3 and engaging the bottom surface 50B in FIG. 4. When the finger 70 engages the top surface 50A of member 50, the finger 70 enters an activation field 74 generated by the top first proximity switch which is detected and used to generate an input to open the window panel. When the user's finger wraps around member 50 to contact the bottom surface 50B, the finger engages an activation field 84 generated by the bottom second proximity switch to initiate an input command to move the window panel toward the closed position, and at the same time allows the user's finger 70 and other portions of the hand to move away from the top activation field 74 due to rotation of the hand and finger 70 during such movement.

The proximity switch assembly 20 is shown in FIGS. 3-7 having first and second proximity sensors 54 and 64 for generating activation fields 74 and 84, respectively. The proximity switch assembly 20 includes a ground layer 58 made of a conductive material, such as copper, shown provided centrally within member 50. The ground layer 58 may include a planar sheet of conductive material that effectively prevents or reduces electric field penetration and is electrically grounded. As such, the ground layer 58 prevents the proximity sensors from adversely affecting the signal of the other sensor. The ground layer 58 has a first major side shown as a top side and an opposite second major side shown as the bottom side, and has a relatively thin thickness at the edges. A first proximity switch is provided on the first side of the ground layer 58 and includes a first dielectric layer 56 and a first proximity sensor 54. The first dielectric layer 56 may include fiberglass or other dielectric material and is disposed between the first proximity sensor 54 and the ground layer 58 to provide dielectric spacing therebetween. The proximity switch assembly 20 also includes a second proximity switch provided on the second side of the ground layer and including a second dielectric layer 60 and a second proximity sensor 64. The second dielectric layer 60 may include fiberglass and is disposed between the ground layer 58 and second proximity sensor 64 to provide dielectric isolation therebetween. Dielectric layers 56 and 60 may serve as circuit board substrates.

A cover material 52 is shown formed surrounding the proximity sensors 54 and 64, dielectric layers 56 and 60 and ground layer 58. The cover material 52 may include a molded polymeric material, according to one embodiment. The cover material 52 may include a material suitable for the armrest, such as a vinyl or leather material, according to other embodiments. The first and second proximity sensors 54 and 64 may be formed on an inner surface of the cover material 52, according to one embodiment. The proximity sensors 54 and 64 may be printed as an ink onto the inner surface of the cover material 52 or otherwise may be formed thereon or disposed between the dielectric layer 56 or 60 and cover material 52. According to another embodiment, the proximity sensors 54 and 64 may be formed on the respective dielectric layers 56 and 60. It should be appreciated that circuit arrangements such as a FR4 hard printed circuit board or flex circuit may be employed.

The proximity switch assembly 20 is further shown including a connector 66 that provides electrical connections to the first and second proximity sensors 54 and 64. The connector 66 may include electrical conductors that connect between the circuit board 68 and each of the first and second proximity sensors 54 and 64 to apply a signal to generate an activation field and an output indicative of user interface with the activation field. The connector 66 also provides a ground line connection to the conductive ground layer 58 such that layer 58 is electrically grounded. The connector 66 may include printed circuits or wires that lead to printed circuits on the inner surface of the cover material 52, according to one embodiment. According to another embodiment, the circuitry traces may connect to circuit traces on the dielectric layers 56 and 60. The resulting package of the ground layer 58, dielectric layers 56 and 60 and first and second proximity sensors 54 and 64 may form a printed circuit board that is covered by the cover material 52.

In operation, the first proximity sensor 54 generates a first activation field 74 on and above the first or top surface 50A of member 50. The first activation field 74 is prevented from extending downward and onto the bottom or second surface due to the conductive ground layer 58. Similarly, the bottom or second proximity sensor 64 generates a second activation field 84 that extends on and below the second or bottom surface 50B. The second activation field 84 is prevented from extending upward and onto first surface due to the conductive ground layer 58.

It should be appreciated that the conductive ground layer 58 has dimensions such as length and width, which are greater than the length and width of the first and second proximity sensors 54 and 64, as shown in FIGS. 5-7. As such, the ground layer 58 extends beyond the circuit traces forming the proximity sensors so as to enhance the signal isolation provided by the ground layer 58 to reduce cross talk or communication of the sensor signals. The ground layer 58 may extend at least one millimeter beyond the peripheral dimensions of the proximity sensors 54 and 64, according to one embodiment. Additionally, the dielectric layers 56 and 60 provide a sufficient isolation distance so as to provide good sensitivity for the proximity sensors 54 and 64. In one embodiment, the dielectric layers 56 and 60 each have a thickness of at least one millimeter, and may have a thickness in the range of one to two millimeters, according to one example. By spacing the proximity sensors 54 and 64 from the ground layer 58 by a minimum distance, good sensitivity is achieved for the proximity switches.

The proximity sensors 54 and 64 are shown and described herein as capacitive sensors, according to one embodiment. Each proximity sensor 54 and 64 includes at least one proximity sensor that provides a sense activation field to sense contact or close proximity (e.g., within one millimeter) of an object, such as the finger (digit) or other part of the hand of an operator in relation to the one or more proximity sensors. The proximity sensors 54 and 64 may also detect a swiping motion by the hand of the operator such as a swipe of a user's finger. Thus, the sense activation field of each proximity sensor 54 and 64 is a capacitive field in the exemplary embodiment and the user's hand including the fingers has electrical conductivity and dielectric properties that cause a change or disturbance in the sense activation field as should be evident to those skilled in the art. However, it should also be appreciated by those skilled in the art that additional or alternative types of proximity sensors can be used, such as, but not limited to, inductive sensors, optical sensors, temperatures sensors, resistive sensors, the like, or a combination thereof. Exemplary proximity sensors are described in the Apr. 9, 2009, ATMEL® Touch Sensors Design Guide, 10620 D-AT42-04/09, the entire reference hereby being incorporated herein by reference.

Figure 8:
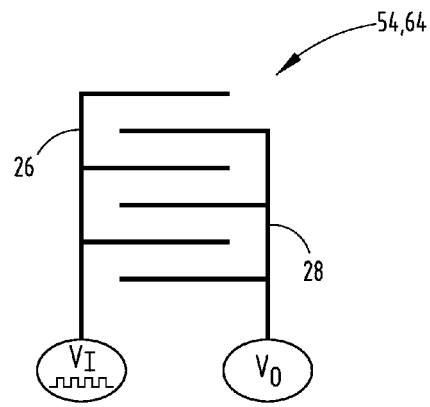
FIG. 8 is a schematic diagram of a capacitive sensor employed in each of the top and bottom proximity switches.

One example of the printed ink proximity sensor 54 and 64 is shown in FIG. 8 having a drive electrode 26 and a receive electrode 28 each having interdigitated fingers for generating a capacitive field. It should be appreciated that each of the proximity sensors 54 and 64 may be otherwise formed such as by assembling a preformed conductive circuit trace onto a substrate according to other embodiments. The drive electrode 26 receives square wave drive pulses applied at voltage $V_I$. The receive electrode 28 has an output for generating an output voltage $V_O$. While a dual wire capacitive sensor is shown and described herein, it should be appreciated that a single wire capacitive sensor may be employed. It should also be appreciated that the electrodes 26 and 28 may be arranged in various other configurations for generating the capacitive field as the activation field.

In the embodiment shown and described herein, the drive electrode 26 of each proximity sensor 54 and 64 is applied with voltage input $V_I$ as square wave pulses having a charge pulse cycle sufficient to charge the receive electrode 28 to a desired voltage. The receive electrode 28 thereby serves as a measurement electrode. When a user or operator, such as the user's finger, enters an activation field, the proximity switch assembly 20 detects the disturbance caused by the finger to the activation field and determines whether the disturbance in either activation fields 74 or 84 is sufficient to activate a door window command. The disturbance of each activation field is detected by processing the charge pulse signal associated with the corresponding signal channel. When the user's finger enters the activation fields 74 or 84 generated by the first and second sensors 54 or 64, the proximity switch assembly 20 detects the disturbance of each contacted activation field via separate signal channels. Each proximity sensor 54 or 64 may have its own dedicated signal channel generating charge pulse counts which may be processed and compared to threshold(s) to make output determinations.

Figure 9:
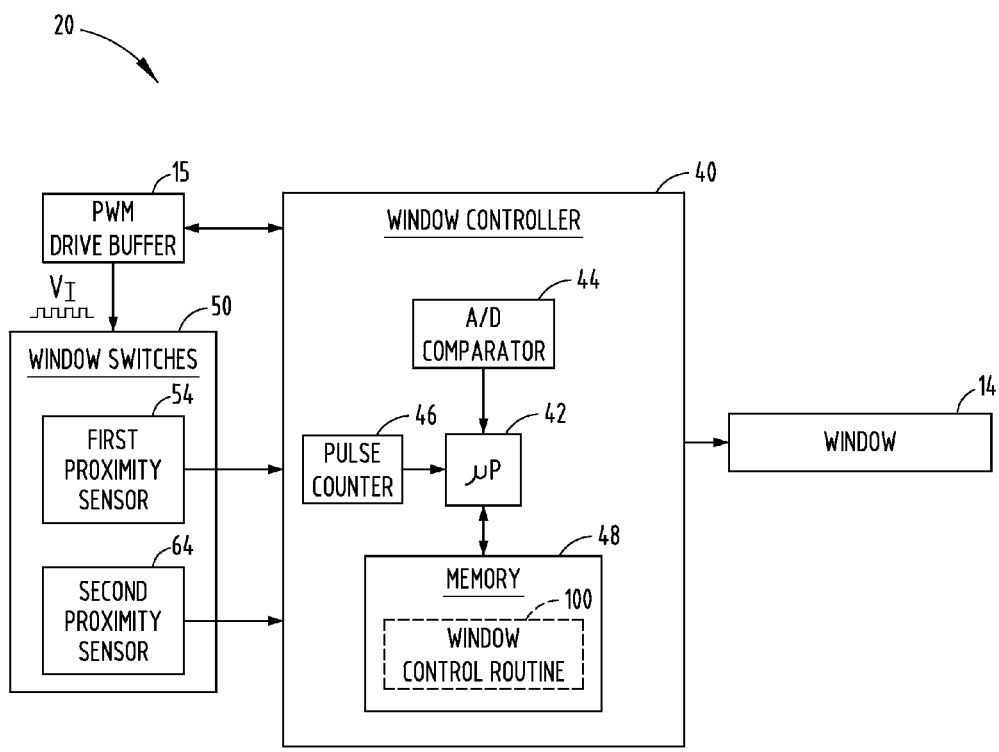
FIG. 9 is a block diagram illustrating the proximity switch assembly, according to one embodiment.

Referring to FIG. 9, the proximity switch assembly 20 for controlling a vehicle window is illustrated according to one embodiment. The first and second proximity sensors 54 and 64 are shown providing inputs to a controller 40, such as a microcontroller. The controller 40 may include control circuitry, such as a microprocessor 42 and memory 48. The control circuitry may include sense control circuitry processing the activation field signal associated with each proximity sensor 54 and 64 to sense user activation of each sensor by comparing the activation field signal to one or more thresholds pursuant to one or more control routines. It should be appreciated that other analog and/or digital control circuitry may be employed to process each activation field signal, determine user activation, and initiate an action. The controller 40 may employ a QMatrix acquisition method available by ATMEL®, according to one embodiment. The ATMEL® acquisition method employs a WINDOWS® host C/C++ compiler and debugger WinAVR to simplify development and testing the utility Hawkeye that allows monitoring in real-time the internal state of critical variables in the software as well as collecting logs of data for post-processing.

The controller 40 provides an output signal to one or more devices that are configured to perform dedicated actions responsive to detected activation of the proximity sensors on the door handle. The one or more devices may include a power window 14. The power window 14 may include a conventional power window having a motor that electrically is actuated to drive a window panel between open and closed positions. The window 14 may include a power door window installed in the door of a vehicle to move up and down. According to other embodiments, a movable panel may include a sunroof or moonroof or a rear window panel. It should be appreciated that other devices may be controlled in response to user activation of the proximity switch assembly 20.

The controller 40 is further shown having an analog to digital (A/D) comparator 44 coupled to the microprocessor 42. The A/D comparator 44 receives the voltage output $V_O$ from each of the proximity sensors 24, converts the analog signal to a digital signal, and provides the digital signal to the microprocessor 42. Additionally, controller 40 includes a pulse counter 46 coupled to the microprocessor 42. The pulse counter 46 counts the charge signal pulses that are applied to each drive electrode of each proximity sensor, performs a count of the pulses needed to charge the capacitor until the voltage output $V_O$ reaches a predetermined voltage, and provides the count to the microprocessor 42. The pulse count is indicative of the change in capacitance of the corresponding capacitive sensor. The controller 40 is further shown communicating with a pulse width modulated drive buffer 15. The controller 40 provides a pulse width modulated signal to the pulse width modulated drive buffer 15 to generate a square wave pulse train $V_I$ which is applied to each drive electrode of each proximity sensor 24. The controller 40 processes one or more control routines, shown in one embodiment including a window control routine 100 stored in memory to monitor user activation of the switch assembly and control movement of the vehicle window.

Figure 10:
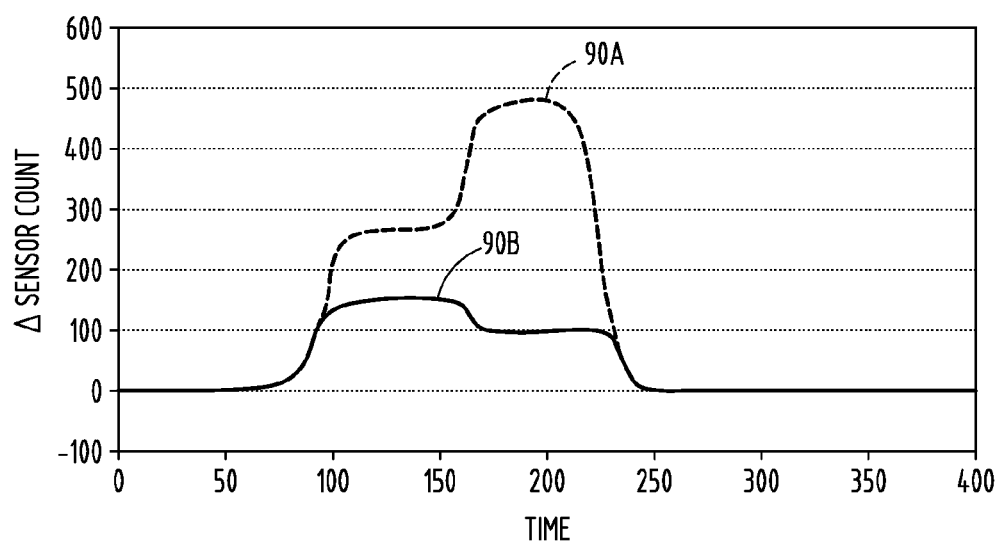
FIG. 10 is a graph illustrating the sensor count signal associated with the bottom proximity switch during user activation.

Operation of the proximity switch assembly may include a user positioning a finger onto the top surface or in close proximity to the top surface of input member 50 to cause a sufficient disturbance of the first activation field 74 to detect user input to close the vehicle window panel. Sensitivity may be adjusted to require that the user press the finger onto the top surface 50A of member 50 to create a sufficient amplitude signal sensed by the activation field 74. When a user desires to raise the window panel, the user advances the finger forward, around input member 50 and into contact with the bottom surface 50B so as to sufficiently engage the second activation field 84 to generate a signal of a sufficient strength indicative of a user input to close the window. When this occurs, the user's hand rotates forward and departs from the top activation field 74. A signal response to the closing operation is shown in FIG. 10 by line 90A in which the user's finger contacting the bottom surface 50B is shown rising to a first level and then added pressure further processing onto the bottom surface 50B by pulling upwards is indicated by the further rise to the peak amplitude. At the same time, the lower curve 90B shows signal response in the top activation field 74 where a user's finger may have some interaction with the activation field 74 which drops off when the user fully extends the finger forward and depresses the bottom surface 50B within activation field 84.

The first proximity switch may be configured to momentarily move the window toward the open position for as long as the user's finger is detected on the first proximity sensor based on a first threshold value and may further initiate the demand to fully open the window upon an increase force applied to the top surface by detecting the output of the first proximity sensor relative to a higher second threshold. Similarly, the second proximity switch may momentarily cause the window to move toward the closed position for as long as the user's finger is detected by the second proximity sensor based on a first threshold value and may further activate the window to the fully closed position based on an increase for supply to the bottom surface detected by the second proximity sensor based on a comparison to a second higher threshold. Further, the vehicle may be actuated to the closed position based on sensed signals from both the first and second proximity sensors. In doing so, the proximity switch assembly may detect activation of the bottom second proximity sensor exceeding a threshold combined with the signal detected by the top first proximity sensor being below a threshold.

Figure 11:
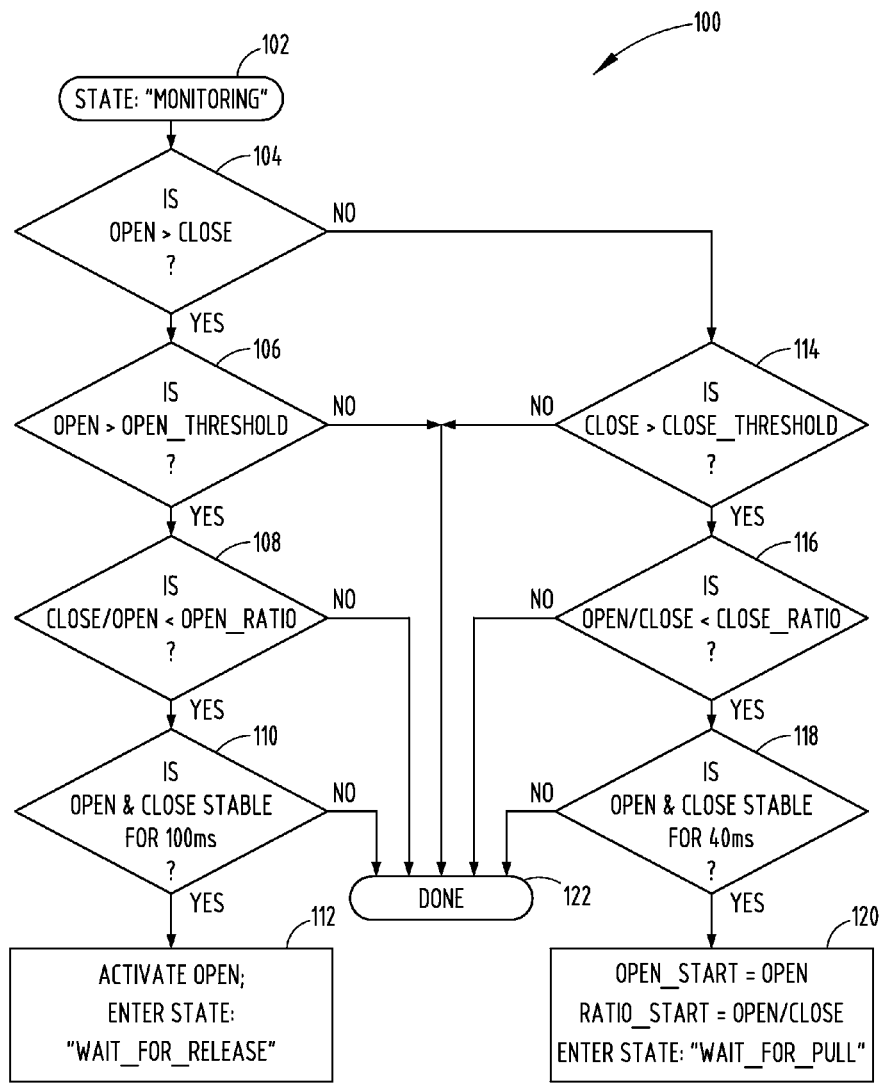
FIG. 11 is a flow diagram illustrating a routine for controlling a vehicle window panel using the proximity switch assembly.

The window control routine 100 is shown in FIG. 11 beginning at step 102 in a monitoring state. At decision step 104, routine 100 determines whether the window open signal is greater than the window close signal. The open signal is the signal sensed by the first proximity sensor for detecting a window open activation input command, whereas the close signal is the signal generated by the second proximity sensor for sensing a window closing activation input command. If the open signal is greater than the closed signal, routine 100 proceeds to decision step 106 to determine if the open signal is greater than an open threshold, and, if so, determines if the ratio of the close signal to the open signal is less than an open ratio at step 108. If not, routine 100 is done at step 122. If the ratio of close to open signals is less than the open ratio, then routine 100 proceeds to step 110 to determine if the open and close signals have been stable for a minimum time period, such as 100 milliseconds, and if so, activates the open enter state and the Wait_For_Release routine at step 112. Otherwise, routine 100 is done at step 122.

Returning to decision step 104, if the open signal is not greater than the close signal, routine 100 proceeds to decision step 114 to determine if the close signal is greater than a close threshold and, if not, is done at step 122. If the close signal is greater than the close threshold, routine 100 proceeds to decision step 116 to determine if a ratio of the open signal to close signal is less than a close ratio and, if not, is done at step 122. If the ratio of the open to close signal is less than the close ratio, routine 100 proceeds to step 118 to determine if the open and close signals are stable for a predetermined time period, such as 40 milliseconds and, if so, proceeds to step 120 to set the open start equal to open, and to set the ratio start equal to a ratio of open to close, and enters the Wait_For_Pull state. Otherwise, routine 100 is done at step 122.

Figure 12:
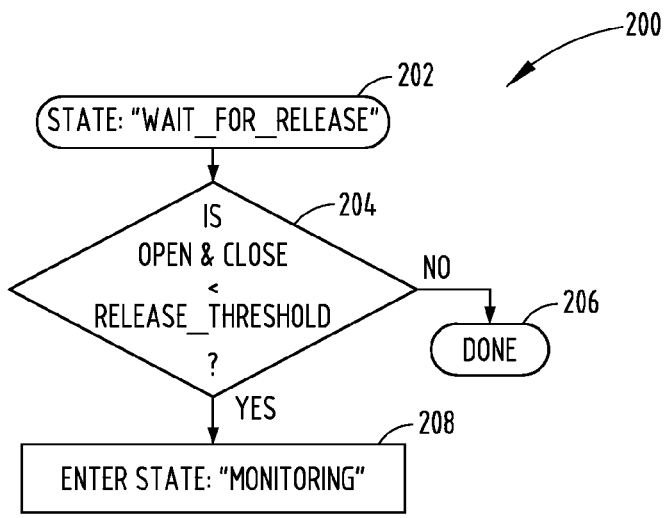
FIG. 12 is a flow diagram illustrating a subroutine for the wait for release state shown in FIG. 11.

Referring to FIG. 12, the Wait_For_Release state subroutine 200 is illustrated beginning at step 202 and proceeding to decision step 204 to determine if the open and close signals are less than a release threshold and, if not, is done at step 206. If the open and close signals are less than the release threshold, subroutine 200 proceeds to step 208 to enter the monitoring state which returns to step 200.

Figure 13:
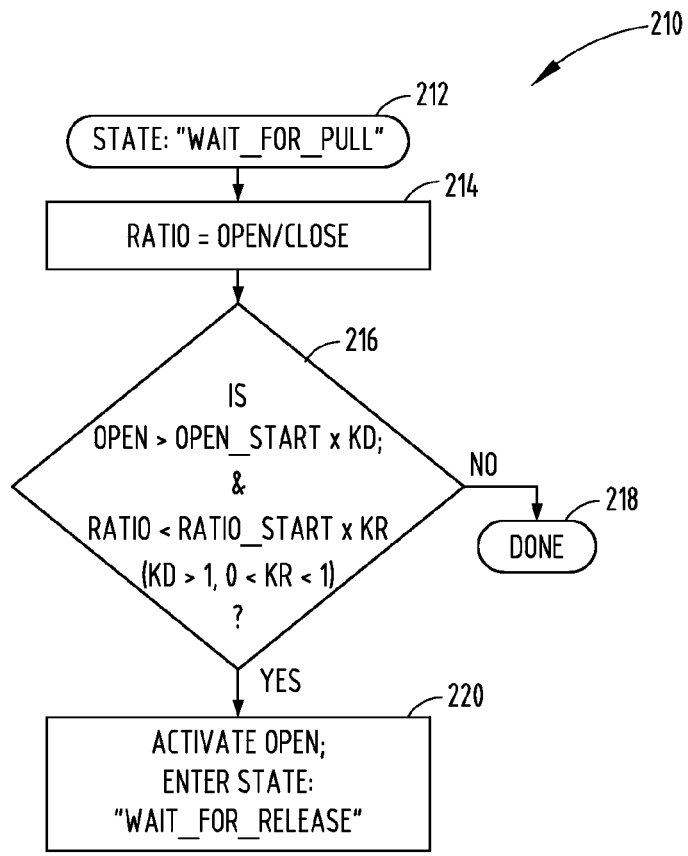
FIG. 13 is a flow diagram illustrating a subroutine for the wait for pull state shown in FIG. 11.

Referring to FIG. 13, the Wait_For_Pull state subroutine 210 is illustrated beginning at step 212. Beginning at step 214, routine 210 sets a ratio equal to the open signal divided by close signal. Next, at decision step 216, routine 210 determines if the open signal is greater than an open start value multiplied by parameter KD and if the ratio is less than the ratio state multiplied by factor KR, where KD is greater than one and KR is between zero and one. If the conditions of decision step 216 are met, routine 210 proceeds to step 220 to activate opening of the window and enters the Wait-For-Release state. Otherwise, routine 210 ends at step 218.

Accordingly, the proximity switch assembly 20 advantageously allow for activation of the window based on an object sensed with first and second proximity sensors on first and second sides and isolated by a ground layer. The system and method advantageously allows a user to effectively control the vehicle window without having to actuate a mechanical input lever and with reduced signal interference, and thereby providing for a robust switch assembly having fewer moving parts and which is cost-effective and easy to operate.

It is to be understood that variations and modifications can be made on the aforementioned structure without departing from the concepts of the present invention, and further it is to be understood that such concepts are intended to be covered by the following claims unless these claims by their language expressly state otherwise.

We claim:
1. A proximity switch assembly comprising:
   a ground layer having non-coplanar top and bottom sides;
   a first proximity switch comprising a first proximity sensor and a first dielectric layer on the top side of the ground layer; and
   a second proximity switch comprising a second proximity sensor and a second dielectric layer on the bottom side of the ground layer.
2. The proximity switch assembly of claim 1, wherein the ground layer comprises a conductive planar sheet having a first major top side and an opposite second major bottom side, wherein the first dielectric layer is on the first major top side and the second dielectric layer is on the second major bottom side.
3. The proximity switch assembly of claim 2 further comprising a cover material covering the first and second proximity sensors.
4. The proximity switch assembly of claim 3, wherein the first and second proximity sensors are printed on an inner surface of the cover material.
5. The proximity switch assembly of claim 2, wherein the first dielectric layer and the second dielectric layer provide circuit board substrates, wherein the first proximity sensor is formed on the first dielectric layer and the second proximity sensor is formed on the second dielectric layer.
6. The proximity switch assembly of claim 1, wherein the assembly is provided in a vehicle.
7. The proximity switch assembly of claim 1, wherein the first proximity switch is actuatable to control operation of a moving panel in a first direction and the second proximity switch is actuatable to control movement of the panel in a second direction.
8. The proximity switch assembly of claim 7, wherein the panel comprises a vehicle window.
9. The proximity switch assembly of claim 8, wherein the first switch is activated on a top surface to open the vehicle window and the second proximity switch is activated on a bottom surface to close the vehicle window.
10. The proximity switch assembly of claim 9, wherein the second proximity sensor senses an increased pressure on the bottom surface indicative of a pull force from a user and closes the vehicle window when a user is indicated to be pulling on the bottom surface.
11. The proximity switch assembly of claim 9, wherein the vehicle window is actuated towards a closed position based on sensed signals from both the first and second proximity sensors.

12. The proximity switch assembly of claim 1, wherein the first and second proximity sensors each comprise capacitive sensors.

13. A vehicle proximity switch assembly comprising:
- a ground layer having non-coplanar first and second major sides;
- a first proximity switch on the first major side of the ground layer and comprising a first proximity sensor and a first dielectric layer for controlling movement of a panel; and
- a second proximity switch on the second major side of the ground layer and comprising a second proximity sensor and a second dielectric layer for controlling movement of the panel.

14. The vehicle proximity switch assembly of claim 13, wherein the first proximity switch controls movement of the panel in a first direction and the second proximity switch controls movement of the panel in a second direction.

15. The vehicle proximity switch assembly of claim 14, wherein the panel comprises a window, wherein the first proximity switch controls movement of the window in an open window direction and the second proximity switch controls movement of the window in a closed window direction.

16. The vehicle proximity switch assembly of claim 13, wherein the first proximity switch is located above the second proximity switch.

17. The vehicle proximity switch assembly of claim 13 further comprising a cover material covering the first and second proximity switches, wherein the first and second proximity sensors are printed on an inner surface of the cover material.

18. The vehicle proximity switch assembly of claim 13, wherein the panel comprises a vehicle window, and wherein the first proximity switch is actuated on a top surface to open the vehicle window and the second proximity switch is actuated on the bottom surface to close the vehicle window, wherein the second proximity sensor senses an increased pressure on the bottom surface of a pulled force from a user and closes the vehicle window when a user is intended to be pulling on the bottom surface.

19. The vehicle proximity switch assembly of claim 13, wherein the first and second proximity sensors each comprises capacitive sensors.

20. The vehicle proximity switch assembly of claim 13, wherein the first major side is a top side and the second major side is a bottom side that is parallel to the top side.

* * * * *